United States Patent [19]
Kirchhoff et al.

[11] Patent Number: 5,866,485
[45] Date of Patent: Feb. 2, 1999

[54] TECHNIQUES FOR ETCHING A SILICON DIOXIDE-CONTAINING LAYER

[75] Inventors: Markus M. Kirchhoff, Ottendorf-Okrilla; Jochen Hanebeck, Dresden, both of Germany

[73] Assignee: Siemens Aktiengesellschaft, Munich, Germany

[21] Appl. No.: 939,216

[22] Filed: Sep. 29, 1997

[51] Int. Cl.⁶ .................................................. H01L 21/302
[52] U.S. Cl. .......................... 438/740; 438/723; 438/724; 438/239
[58] Field of Search ................................. 438/723, 724, 438/740, 743, 744, 239

[56] References Cited

U.S. PATENT DOCUMENTS

| | | | |
|---|---|---|---|
| 4,376,672 | 3/1983 | Wang et al. | 156/643 |
| 5,302,236 | 4/1994 | Tahara et al. | 156/643 |
| 5,595,627 | 1/1997 | Inazawa et al. | 156/643.1 |
| 5,700,737 | 12/1997 | Yu et al. | 438/636 |

FOREIGN PATENT DOCUMENTS

| | | |
|---|---|---|
| 644584 | 3/1995 | European Pat. Off. . |
| 651434 | 5/1995 | European Pat. Off. . |

OTHER PUBLICATIONS

"Characterization of Highly Selective $SiO_2/Si_3N_4$ Etching of High Aspect Ratio Holes"; Hisataka et al.; Jpn. J. Appl. Phys., Part 1 (1996), 35(4B), pp. 2488–2493.

Primary Examiner—Benjamin Utech
Assistant Examiner—George Goudreau
Attorney, Agent, or Firm—Stanton C. Braden

[57] ABSTRACT

A method in a plasma processing chamber for improving oxide-to-nitride selectivity while etching a borophosphosilicate glass (BPSG)-containing layer to create a self-aligned contact on a semiconductor substrate. The (BPSG)-containing layer is disposed on a SiN layer and into a via formed through the SiN layer. The method includes placing the substrate into the plasma processing chamber, and flowing an etchant source gas into the plasma processing chamber. The etchant source gas includes $C_4F_8$ and an additive gas other than carbon monoxide (CO). The additive gas includes molecules having both oxygen atoms and carbon atoms in a 1:1 ratio. The method further includes exciting the etchant source gas with a radio frequency (RF) power source having a frequency of 13.56 MHz to strike a plasma from the etchant source gas, thereby etching at least partially through the BPSG-containing layer.

24 Claims, 3 Drawing Sheets

TECHNIQUES FOR ETCHING A SILICON DIOXIDE-CONTAINING LAYER

BACKGROUND OF THE INVENTION

The present invention relates to the manufacture of integrated circuits. More particularly, the present invention relates to improved techniques for etching through a silicon dioxide-containing layer during the manufacture of integrated circuits.

In the manufacture of integrated circuits, a silicon dioxide-containing layer, such as borophosphosilicate glass (BPSG) layer, may be employed to insulate two conductive layers from one another. If an electrical contact is desired at a specific place between the two conductive layers, a contact hole may be formed through the silicon dioxide-containing layer into which a conductive material may be deposited to facilitate the electrical connection between the two conductive layers.

To facilitate discussion, FIG. 1 depicts a wafer 100, which includes a silicon substrate 102. Above silicon substrate 102, a polysilicon layer 104, a tungsten silicide layer 106, and a silicon nitride layer 109 are blanket deposited. In FIG. 1, silicon substrate 102 is shown exposed to a contact hole 108 through polysilicon layer 104, tungsten silicide layer 106, and silicon nitride layer 109. Contact hole 108 may be formed by masking wafer 100 with a conventional photoresist masking technique and etching through tungsten silicide layer 106 and polysilicon layer 104 with an appropriate etchant.

In FIG. 2, another silicon nitride dielectric layer is deposited above silicon nitride layer 109 and along the sidewall of contact hole 108, thereby forming silicon nitride layer 110 in FIG. 2. At the bottom of contact hole 108, the silicon nitride material has been etched back to expose silicon substrate 102 to contact hole 108.

In FIG. 3, a silicon dioxide-containing layer 302 is blanket deposited above silicon nitride layer 110 and into contact hole 108. In FIG. 4, silicon dioxide-containing layer 302 is masked with an appropriate photoresist or hard mask and etched to remove the silicon dioxide material from contact hole 108. As shown in FIG. 4, mask 404 has an opening that is slightly larger than the cross-section of contact hole 108 to create what is referred to in the art as a self-aligned contact through silicon dioxide containing layer 302 and contact hole 108. Self-aligned contacts ensure that a subsequently deposited conductive material into contact hole 108 will form an electrical contact with silicon substrate 102 even if the opening in silicon dioxide-containing containing layer 302 is slightly misaligned due to, for example, mask misalignment.

After the silicon dioxide containing layer 302 is etched in FIG. 4, mask 404 may then be removed and a conductive material, e.g., a metallic material or doped polysilicon, may be deposited above silicon dioxide-containing layer 302 and into contact hole 108 to form an electrical contact with underlying silicon substrate 102. In this manner, an electrical path is created through silicon dioxide-containing layer 302 by way of contact hole 108.

In the etching of silicon dioxide-containing layer 302, it is important for economic reasons to select an etch process that has a high etch rate through silicon dioxide-containing layer 302. It is equally important, however, that the chosen etch process has a high selectivity to silicon nitride so that silicon nitride layer 110 is not inadvertently removed while etching away the glass material in contact hole 108. This is because an undue amount of erosion of silicon nitride layer 110 in shoulder regions 410A and 410B as well as along the sidewalls of contact hole 108 may cause an inadvertent electrical short between the subsequently deposited conductive material in contact hole 108 and tungsten silicide layer 106. As can be appreciated by those skilled in the art, such inadvertent electrical shorts are undesirable as they may cause the fabricated IC to be rejected as defective.

In the prior art, when BPSG is employed as the insulating layer, its etching is typically performed in a plasma processing chamber using $CHF_3$ as the main etchant source gas. Although $CHF_3$ offers a satisfactory BPSG etch rate, the selectivity to silicon nitride is typically less than desired. By way of example, typical BPSG etches using $CHF_3$ as the etchant source gas tend to result in a BPSG:silicon nitride selectivity in the range of 5:1 (i.e., the etch rate through BPSG is roughly 5 times the etch rate through silicon nitride) or even lower. For some IC's, the BPSG:silicon nitride selectivity offered by the $CHF_3$ etchant source gas is unsatisfactory.

Selectivity to silicon nitride may be improved by using an etchant source gas that uses $C_4F_8$ and CO. However, the improved selectivity is counterbalanced by other disadvantages of the $C_4F_8$/CO chemistry. By way of example, CO gas with a high degree of purity is relatively expensive to acquire, which disadvantageously increases the cost of the process. More significantly, it has been discovered that the use of the CO chemistry in a plasma processing chamber typically results in metal contamination of the wafer during the BPSG etch step. It is discovered that this metal contamination is caused by the chemical reactions between the CO additive gas and metallic components of the chamber. By way of example, CO will combine with nickel from the chamber parts to form $Ni(CO)_4$, which subsequently decomposes and causes nickel atoms to be formed on top of the wafer and to defuse into the devices of the wafer, potentially changing the electrical characteristics of the devices. The CO additive gas may also combine with iron and other metallic components of the chamber to, for example form $Fe(CO)_5$ and/or other compounds and cause similar metal contamination problems on the wafer.

In view of the foregoing, there are desired improved techniques for etching through the silicon dioxide-containing layer during the manufacture of an integrated circuit. The improved silicon dioxide-containing layer preferably employs an additive gas other than the aforementioned CO additive gas to reduce costs as well as to reduce and/or eliminate the aforementioned metallic contamination problem. The improved etch technique also preferably employs an etchant source gas that offers a commercially advantageous etch rate through the silicon dioxide-containing layer while maintaining a high selectivity to the underlying silicon nitride layer to prevent the formation of inadvertent electrical shorts in the vicinity of the contact hole.

SUMMARY OF THE INVENTION

The invention relates, in one embodiment, to a method in a plasma processing chamber for etching a silicon dioxide-containing layer on a semiconductor substrate. The silicon dioxide-containing layer is disposed on a SiN layer. The method includes placing the substrate into the plasma processing chamber, and flowing an etchant source gas into the plasma processing chamber. The etchant source gas includes $C_4F_8$ and an additive gas other than carbon monoxide (CO). The additive gas includes molecules having both oxygen atoms and carbon atoms. The method further includes striking a plasma from the etchant source gas to etch at least partially through the silicon dioxide-containing layer.

In another embodiment, the invention relates to a method in a plasma processing chamber for improving oxide-to-nitride selectivity while etching a borophosphosilicate glass (BPSG)-containing layer to create a self-aligned contact on a semiconductor substrate. The (BPSG)-containing layer is disposed on a SiN layer and into a via formed through the SiN layer. The method includes placing the substrate into the plasma processing chamber, and flowing an etchant source gas into the plasma processing chamber. The etchant source gas includes $C_4F_8$ and an additive gas other than carbon monoxide (CO). The additive gas includes molecules having both oxygen atoms and carbon atoms in a 1:1 ratio. The method further includes exciting the etchant source gas with a radio frequency (RF) power source having a frequency of 13.56 MHz to strike a plasma from the etchant source gas, thereby etching at least partially through the BPSG-containing layer.

In accordance with one aspect of the present invention, the additive gas may be any gas selected from the group that includes aldehydes, ketons, oxohalides, carbonates, carbonic acids, dialdehydes, and hydroxyaldehyds. By way of example, the replacement additive gas may be any one of HCHO (methanal), $CH_3CHO$ (ethanal), $CFH_2CHO$, $CF_2HCHO$, $CF_3CHO$, $COF_2$, $CH_3COCH_3$ (aceton) or its fluorinated derivatives (CHxFyCOCuFv, with x+y=3 and u+v=3). Other exemplary replacement additive gases include HCOOH (formic acid) $CH_3OH$, $CH_3CH_2OH$, OHC—CHO, HOOC—COOH, AND $HOCH_2$—CHO. In one embodiment, the ratio of carbon atoms to oxygen atoms in a molecule of the replacement additive gas is preferably, but not necessarily, 1 to 1.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

To facilitate discussion.

DETAILED DESCRIPTION OF THE PREFERRED EMBODIMENTS

Figure 1:
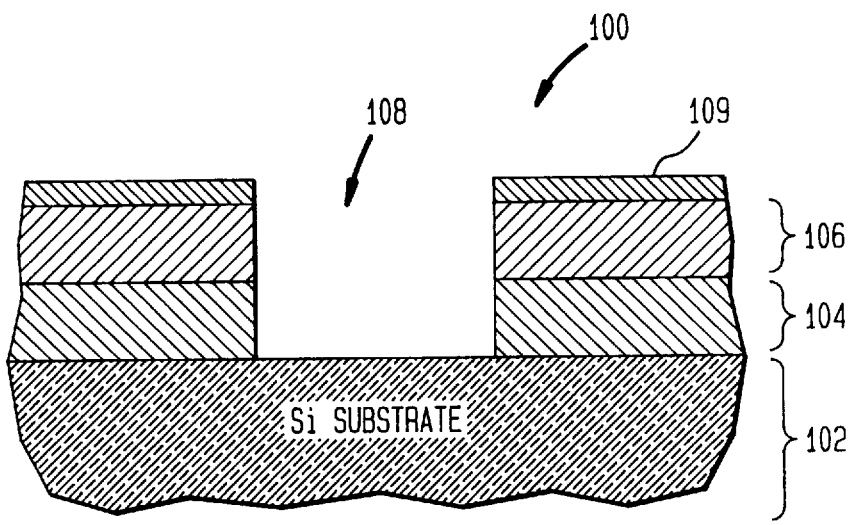
FIG. 1 depicts a wafer, which includes a polysilicon layer and a tungsten silicide layer disposed above a silicon substrate.
Figure 2:
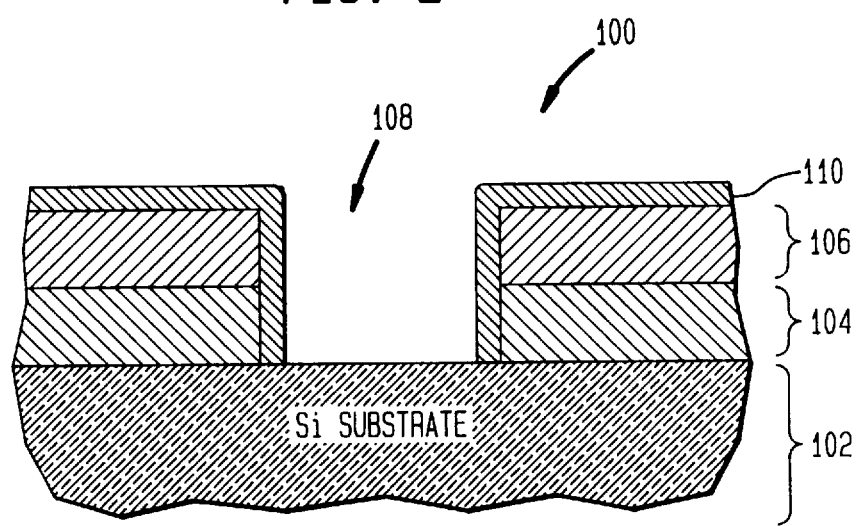
In FIG. 2, a silicon nitride dielectric layer is deposited above tungsten silicide layer of FIG. 1 and into the contact hole in the polysilicon and tungsten silicide layers.
Figure 3:
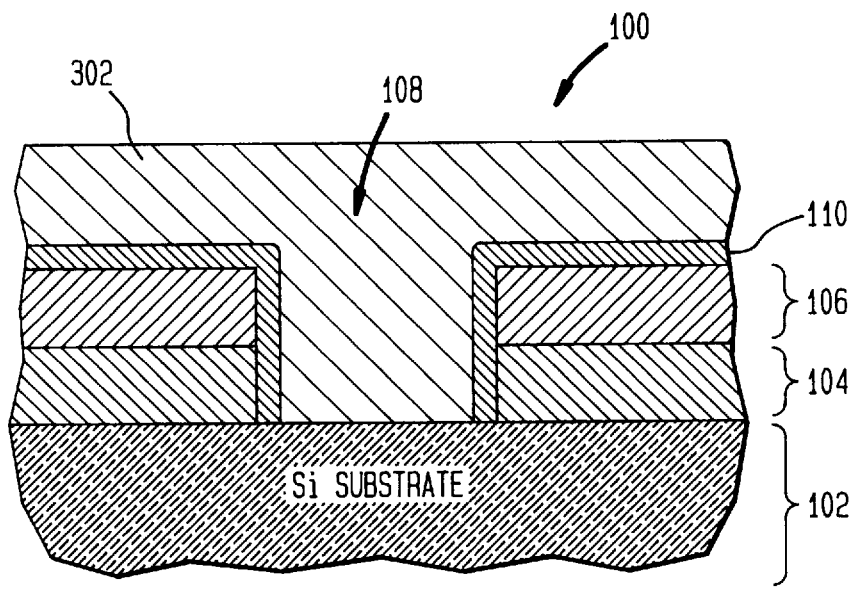
In FIG. 3, a silicon dioxide-containing layer is blanket deposited above the silicon nitride layer and into the contact hole of FIG. 2.
Figure 4:
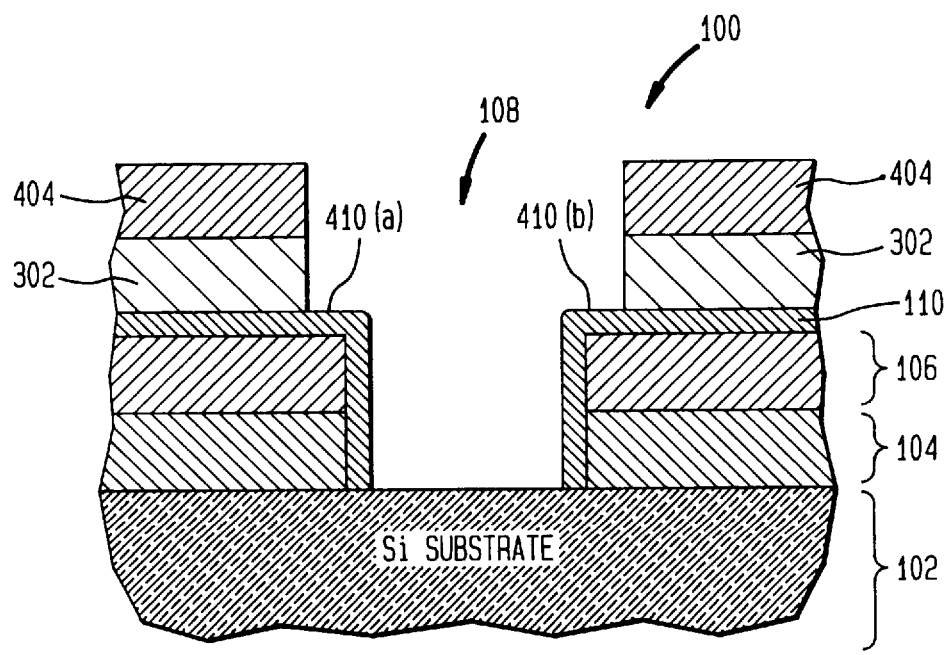
In FIG. 4, the silicon dioxide-containing layer is masked with an appropriate photoresist or hard mask and etched to remove the silicon dioxide material from contact hole 108 of FIG. 3 to form a self-aligned contact.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the present invention, there are provided improved techniques in a plasma processing chamber for etching a silicon dioxide-containing layer on a semiconductor substrate. The silicon dioxide-containing layer may represent any dielectric layer that contains silicon dioxide ($SiO_2$), including, for example, BPSG, or PSG. In light of the discovered metal contamination problem and the insight into its cause, the improved method preferably replaces the carbon monoxide (CO) additive gas in the etchant source gas with an additive gas that offers a high etch rate through the silicon dioxide-containing layer while maintaining good selectivity to silicon nitride. The alternative additive gas is preferably selected to reduce costs as well as to reduce and/or substantially eliminate the metallic contamination problem associated with the prior art carbon monoxide (CO) additive gas.

In a preferred embodiment, the replacement additive gas is preferably a gas whose molecules contains both oxygen atoms and carbon atoms. Although the exact mechanism involved in plasma etching has not yet been fully understood by contemporary science, it is believed that the use of an additive gas whose molecules contain both oxygen and carbon atoms offers the most advantageous balance between the rate of oxidation (due to the presence of oxygen reactive species) and polymer formation (due to the presence of the carbon reactive species) in the plasma processing chamber. It is this balance, which is due to the presence of both the carbon and oxygen atoms in a molecule, that facilitates etching through the silicon dioxide-containing layer with the desired etch rate, the desired level of uniformity, micro loading, and selectivity.

In accordance with one aspect of the present invention, the replacement additive gas may be any gas, other than CO, selected from the group that includes aldehydes, ketons, oxohalides, carbonates, carbonic acids, dialdehydes, and hydroxyaldehyds. By way of example, the replacement additive gas may be any one of HCHO (methanal), $CH_3CHO$ (ethanal), $CFH_2CHO$, $CF_2HCHO$, $CF_3CHO$, $COF_2$, $CH_3COCH_3$ (aceton) or its fluorinated derivatives (CHxFyCOCuFv, with x+y=3 and u+v=3). Other exemplary replacement additive gases include HCOOH (formic acid) $CH_3OH$, $CH_3CH_2OH$, OHC—CHO, HOOC—COOH, AND $HOCH_2$—CHO. In one embodiment, the ratio of carbon atoms to oxygen atoms in a molecule of the replacement additive gas is preferably, but not necessarily, 1 to 1.

It is contemplated that the improved silicon dioxide-containing layer etch technique may be performed in any suitable plasma processing chamber, including the TEL 88 DRM reactive ion etching (RIE) etching system by the Tokyo Electronics company of Tokyo, Japan or the MXP+ plasma processing system available from Applied Materials, Inc. of Santa Clara, Calif.

The use of a replacement additive gas, other than CO, whose molecules have both oxygen and carbon atoms advantageously permits the silicon dioxide-containing layer, e.g., BPSG, to be etched efficiently while minimizing the aforementioned metal contamination problem and offering a high selectivity to silicon nitride. It is contemplated that the inventive silicon dioxide-containing layer etching technique is particularly well adapted for fabricating dynamic random access memory circuits (DRAMs).

Figure 5:
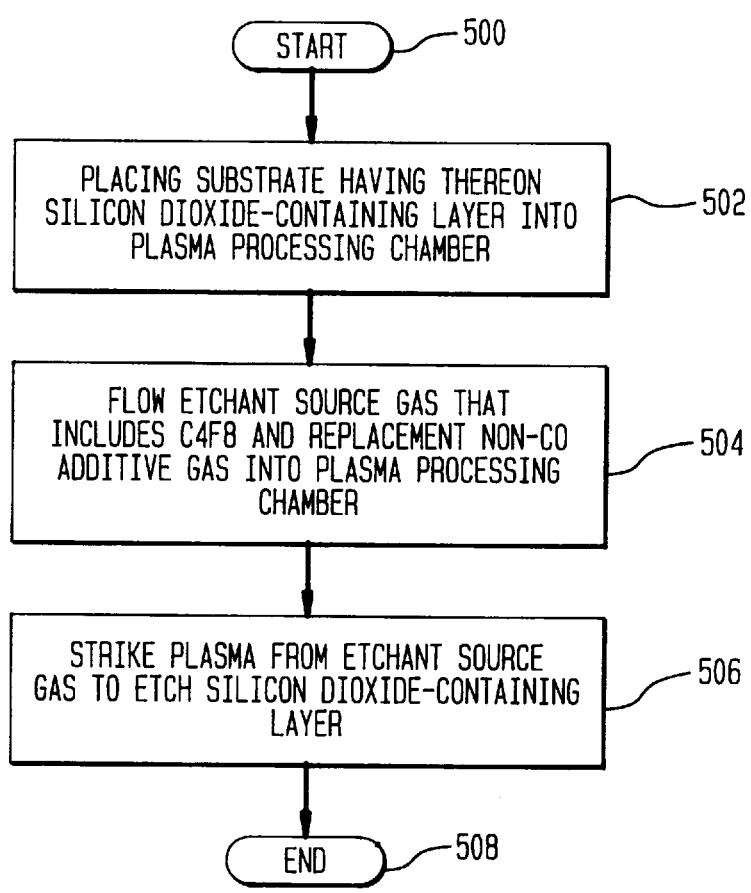
FIG. 5 illustrates, in accordance with one embodiment of the present invention, the steps involved in the improved silicon dioxide-containing layer etching technique.

FIG. 5 illustrates, in accordance with one embodiment of the present invention, the steps involved in the improved silicon dioxide-containing layer etching technique. In step 502, a substrate having thereon a silicon dioxide-containing layer is placed into the plasma processing chamber. In one embodiment, this silicon dioxide-containing layer represents a layer of BPSG. As mentioned earlier, a layer of silicon nitride may underlie the silicon dioxide-containing layer. In step 504, an etchant source gas that includes $C_4F_8$ and the improved additive gas, other than CO, is added. As discussed, the improved additive gas preferably represents a gas whose molecules contain both carbon and oxygen atoms. Other additive gases such as argon, or another inert gas, may also be added if desired. Preferably but not necessarily, the ratio of the carbon to oxygen atoms is 1:1 in molecules of the alternative additive gas. In step 506, a plasma is struck from the etchant source gas to etch at least partially through the silicon dioxide-containing layer. The etching may be end-pointed when the portions of the silicon-dioxide containing layer unprotected by the mask are etched through.

EXAMPLE

It is contemplated that the approximate process parameters below are suitable for etching through a BPSG layer disposed on a 200 mm wafer in the aforementioned TEL 85 DRM RIE etching system.

TABLE 1

| PARAMETERS | APPROXIMATE VALUES |
| --- | --- |
| Pressure (mTorr) | 40 |
| Power (W) | 1,700 |
| Gap (mm) | 37 |
| Magnetic Field | 120 |
| Argon (sccm) | 285 |
| C4F8 flow | 10 |
| improved additive gas flow (sccm) | 225 |

While this invention has been described in terms of several preferred embodiments, there are alterations, permutations, and equivalents which fall within the scope of this invention. It is therefore intended that the following appended claims be interpreted as including all such alterations, permutations, and equivalents as fall within the true spirit and scope of the present invention.

What is claimed is:

1. In a plasma processing chamber, a method for etching a silicon dioxide-containing layer on a semiconductor substrate, said silicon dioxide-containing layer being disposed on a silicon nitride (SiN) layer, comprising:

placing said substrate into said plasma processing chamber;

flowing an etchant source gas into said plasma processing chamber, said etchant source gas including $C_4F_8$ and an additive gas other than carbon monoxide (CO), said additive gas including molecules having both oxygen atoms and carbon atoms; and striking a plasma from said etchant source gas to etch at least partially through said silicon dioxide-containing layer.

2. The method of claim 1 wherein said silicon dioxide-containing layer is borophosphosilicate glass (BPSG).

3. The method of claim 1 wherein said additive gas is selected from the group consisting of $CH_3CHO$, $CFH_2CHO$, $CF_2HCHO$, and $CF_3CHO$.

4. The method of claim 1 wherein said additive gas is selected from the group consisting of $CH_3COCH_3$ and its fluorinated derivatives.

5. The method of claim 1 wherein said additive gas is HCOOH.

6. The method of claim 1 wherein said additive gas is selected from the group consisting of OHC—CHO, HOOC—COOH, and $HOCH_2$—CHO.

7. The method of claim 1 wherein a ratio of said oxygen atoms and said carbon atoms is 1:1 in said molecules of said additive gas.

8. The method of claim 7 wherein said additive gas is $COF_2$.

9. The method of claim 7 wherein said additive gas is HCHO.

10. The method of claim 7 wherein said additive gas is $CH_3OH$.

11. The method of claim 7 wherein said additive gas is $CH_3CH_2OH$.

12. In a plasma processing chamber, a method for improving oxide-to-nitride selectivity while etching a borophosphosilicate glass (BPSG)-containing layer to create a self-aligned contact on a semiconductor substrate, said (BPSG)-containing layer being disposed on a silicon nitride (SiN) layer and into a via formed through said SiN layer, comprising:

placing said substrate into said plasma processing chamber;

flowing an etchant source gas into said plasma processing chamber, said etchant source gas including $C_4F_8$ and an additive gas other than carbon monoxide (CO), said additive gas including molecules having both oxygen atoms and carbon atoms in a 1:1 ratio; and exciting said etchant source gas with a radio frequency (RF) power source having a frequency of 13.56 MHz to strike a plasma from said etchant source gas, thereby etching at least partially through said BPSG-containing layer.

13. The method of claim 12 wherein said etchant source gas includes Argon.

14. In a plasma processing chamber, a method for fabricating a dynamic random access memory circuit (DRAM) on a semiconductor substrate, including etching a borophosphosilicate glass (BPSG)-containing layer disposed on a silicon nitride (SiN) layer, comprising:

placing said substrate into said plasma processing chamber;

flowing an etchant source gas into said plasma processing chamber, said etchant source gas including $C_4F_8$ and a first additive gas other than carbon monoxide (CO), said first additive gas including molecules having both oxygen atoms and carbon atoms; and striking a plasma from said etchant source gas to etch at least partially through said BPSG-containing layer.

15. The DRAM fabricating method of claim 14 wherein a ratio of said oxygen atoms and said carbon atoms is 1:1 in said molecules of said first additive gas.

16. The DRAM fabricating method of claim 15 wherein said first additive gas is $COF_2$.

17. The DRAM fabricating method of claim 15 wherein said first additive gas is HCHO.

18. The DRAM fabricating method of claim 15 wherein said first additive gas is $CH_3OH$.

19. The DRAM fabricating method of claim 15 wherein said first additive gas is $CH_3CH_2OH$.

20. The DRAM fabricating method of claim 14 wherein said etchant source gas includes Argon.

21. The DRAM fabricating method of claim 20 wherein said first additive gas is selected from the group consisting of $CH_3CHO$, $CFH_2CHO$, $CF_2HCHO$, and $CF_3CHO$.

22. The DRAM fabricating method of claim 20 wherein said first additive gas is selected from the group consisting of $CH_3COCH_3$ and its fluorinated derivatives.

23. The DRAM fabricating method of claim 20 wherein said first additive gas is HCOOH.

24. The DRAM fabricating method of claim 20 wherein said first additive gas is selected from the group consisting of OHC—CHO, HOOC—COOH, and $HOCH_2$—CHO.

* * * * *